Nov. 10, 1970 W. C. SEELBACH ET AL 3,539,836

CLOCKED DELAY TYPE FLIP FLOP

Filed Dec. 16, 1966 2 Sheets-Sheet 1

INVENTORS
Walter C. Seelbach
Ury Priel

BY
Mueller, Aichele & Rauner
ATTY'S.

INVENTORS
Walter C. Seelbach
Ury Priel
BY
Mueller, Aichele & Rauner
ATTYS.

United States Patent Office 3,539,836

Patented Nov. 10, 1970

3,539,836

CLOCKED DELAY TYPE FLIP FLOP

Walter C. Seelbach, Scottsdale, and Ury Priel, Phoenix, Ariz., assignors to Motorola, Inc., Franklin Park, Ill., a corporation of Illinois Filed Dec. 16, 1966, Ser. No. 602,194
Int. Cl. H03k *17/26, 3/12*
U.S. Cl. 307—269 7 Claims

ABSTRACT OF THE DISCLOSURE

A gated delay memory element also known as a gated D type flip flop which operates in the current mode and utilizes a master-slave scheme. This flip flop is constructed as a monolithic integrated circuit using high speed emitter-coupled transistor circuitry and features asynchronous set-reset logic capability. The master and slave flip flop portions each include a basic internal bistable switching element to which is connected emitter coupled transistor logic circuitry for controlling the conductive state of the bistable element in each flip flop portion.

This invention relates to flip flop circuitry for use in digital computers, control systems and the like and more particularly to a single phase delay ("D") type flip flop constructed in a monolithic integrated circuit.

BACKGROUND OF THE INVENTION

Current mode master-slave type flip flops are known in the art of computer logic. However, prior to the invention to be described herein there was not available or otherwise known a current mode gated delay type flip flop utilizing high speed current mode logic in a single ended master-slave flip flop circuit configuration requiring no charge storage elements such as capacitors, requiring no master-slave feedback and having asynchronous set-reset control capability. The delay flip flop according to this invention overcomes problems of slow speeds which have plagued prior art flip flops and the circuit embodiment may be constructed in a highly reliable monolithic integrated circuit at a minimum of cost. The flip flop circuit of this invention has eliminated the problem of racing which is quite common in other known delay type flip flops, and includes a transistor override capability for the DC set and reset functions which is not dependent upon bias resistance at the common emitter node of the cross coupled holding transistors of the flip flop; this latter feature is quite advantageous in that it reduces parasitic capacitance at the common emitter node and improves the AC performance of the integrated circuit.

SUMMARY OF THE INVENTION

An object of this invention is to provide a new high speed delay type flip flop constructed as a monolithic integrated circuit.

Another object of this invention is to provide a new delay type flip flop requiring no capacitance or other charge storage elements, requiring no slave to master feedback and which may be asynchronously controlled by said set and reset signals applied thereto.

Another object of this invention is to provide a delay type flip flop wherein race problems have been eliminated and wherein parasitic capacitance is minimized, thereby optimizing the AC performance of the circuit.

The present invention features a single phase master-slave delay type current mode flip flop having master and slave flip flop portions which are alternately enabled for conduction by a source of binary clock signals.

A master control transistor is emitter coupled to a master reference transistor in the master portion of the flip flop, and these transistors are further connected to a basic bistable element of the master portion of the flip flop. The conductive state of this bistable element may be changed when control signals are applied to the master control transistor and when the master portion of the flip flop enabled by the binary clock signals.

Another feature of this invention is the provision of set, reset, and clock transistors connected in parallel with each other in a master-slave control section of the flip flop. The set, reset and clock transistors are connected to the master and slave flip flop portions in a network configuration wherein either set, reset or clock (respectively) signals which are applied to these transistors will be able to change the conductive state of the delay flip flop.

Another feature of this invention is the provision of a reference transistor and a slave clocking transistor differentially connected to control the conductive state of the slave portion of the flip flop, and a second master reference transistor and a master clocking transistor differentially connected to control the conductive state of the master portion of the flip flop. Each f these last named differentially connected transistor pairs is DC coupled to the master-slave control section and controlled by set, reset and clock signals in such a manner that the master and slave flip flop portions are alternately locked out and enabled as clock signals or set and reset signals shift from a high level of logic to a low level of logic and vice versa.

Another feature of this invention is the provision of a bias driver network connected across a flip flop power supply and having four intermediate points of diminishing reference potential. This bias driver is connected to the above mentioned reference transistors in the master and slave portions of the flip flop in a bias circuit configuration that insures that the master portion of the flip flop will be locked in its previous conductive state prior to the time that the slave portion of the flip flop is enabled by a change in the level of the clock.

Briefly, this invention is directed to a delay type master-slave flip-flop connected as a monolithic integrated circuit and biased to switch in the high speed current mode. The delay flip-flop includes a slave flip-flop portion having a basic internal bistable element and a pair of transistors (reference and clocking) differentially connected between the above internal bistable element and a source of clock, set and reset signals. Further included in the delay flip flop is a master flip-flop portion, also having a basic internal bistable element to which is connected a pair of differentially coupled reference and clocking transistors. These reference and clocking transistors are also conductively controlled by the clock, set and reset signals which are DC coupled thereto. The master flip-flop output terminals are connected to a pair of pullover or slave control transistors and via this latter connection binary information from the master portion of the flip-flop is transferred to the internal bistable element of the slave portion of the flip-flop. One oft he pairs of differentially coupled transistors in each portion of the delay flip-flop is referred to as a clocking transistor since it is DC coupled to a source of clock signals and biased into conduction by clock signals to override its assocaited reference transistor and control the state of the flip-flop. When conducting, the clocking transistor in the slave flip-flop portion enables that portion whereas conduction of the clocking transistor in the master flip-flop portion latches or locks out the master portion. When the clock, set or reset signals shift to another logical level, the slave portion of the flip-flop is locked out and the master portion of the flip-flop is enabled to receive binary logical information. A master control transistor is differentially connected to another reference transistor in the master portion of the flip-flop and is further connectable to a single ended source of signals ($A_N$) for latching out the holding transistors in the bistable element of the master portion and changing the conductive state thereof when the master flip-flop portion is enabled.

When the master flip-flop portion is again inhibited or latched out and the clock signals return to the other of two possible logical levels, the binary conditions of the master flip-flop portion is shifted into the slave flip-flop portion only after the state of the master flip-flop portion has been fixed. The master portion of the flip-flop as well as the slave portion thereof include set and reset transistors which are also connected to the holding transistors of the internal bistable elements of these flip-flop portions and may be asynchronously controlled by set and reset signals independently of the level of the clock.

DESCRIPTION OF THE PREFERRED EMBODIMENT

Figure 1:
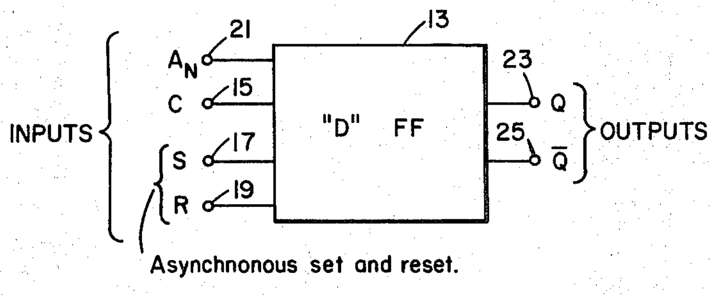
FIG. 1 is a block diagram showing the inputs and outputs of a conventional delay type flip-flop.

Referring to the drawings in more detail, FIG. 1 represents a typical delay ("D") type of flip-flop 13 having clock, set and reset inputs 15, 17 and 19 respectively which are connected to provide clock and asynchronous set and reset control for the flip-flop. A control input terminal 21 is connectable to a singfile ended source of control signals $A_N$ which are capable of changing the conductive state of the flip-flop. Output terminals Q and $\overline{Q}$ represent the binary outputs of the flip-flop at terminals 23 and 25.

Figure 2:
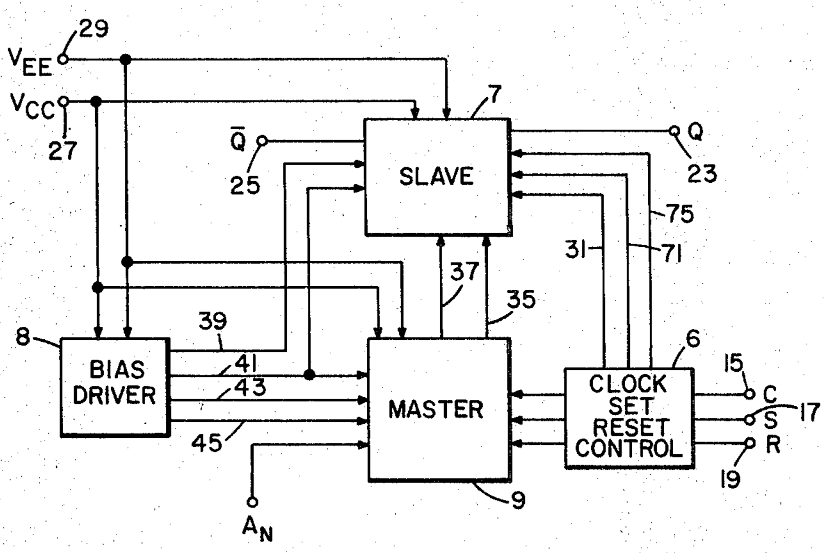
FIG. 2 is a block diagram representation of the delay type flip-flop according to this invention.

The D type flip-flop 13 shown as a single block in FIG. 1 is embodied in FIG. 2 in a master-slave flip-flop including a slave flip-flop portion 7 which is driven by the master flip-flop portion 9, and both of these portions are connected to a centralized clock and set-reset control network 6. Clock, set and reset signals which are coupled to the inputs of network 6 may be asynchronously applied via lines 31, 71 and 75 to control the conductivity of the master and slave portions of the flip-flop. The source of control signals $A_N$ is coupled to the master portion 9 of the flip-flop for controlling this portion provided the master portion 9 is enabled by clock. A bias driver 8 which will be discussed in more detail in another section of the specification provides the proper bias potentials for the slave and master portions of the flip-flop via lines 39, 41, 43 and 45. The bias driver 8 includes four points 85, 87, 89 and 91 of reference potential intermediate the $V_{EE}$ potential applied to terminal 29 and the collector potential $V_{CC}$ applied to terminal 27.

IDENTIFICATION OF CIRCUIT COMPONENTS

Figure 3:
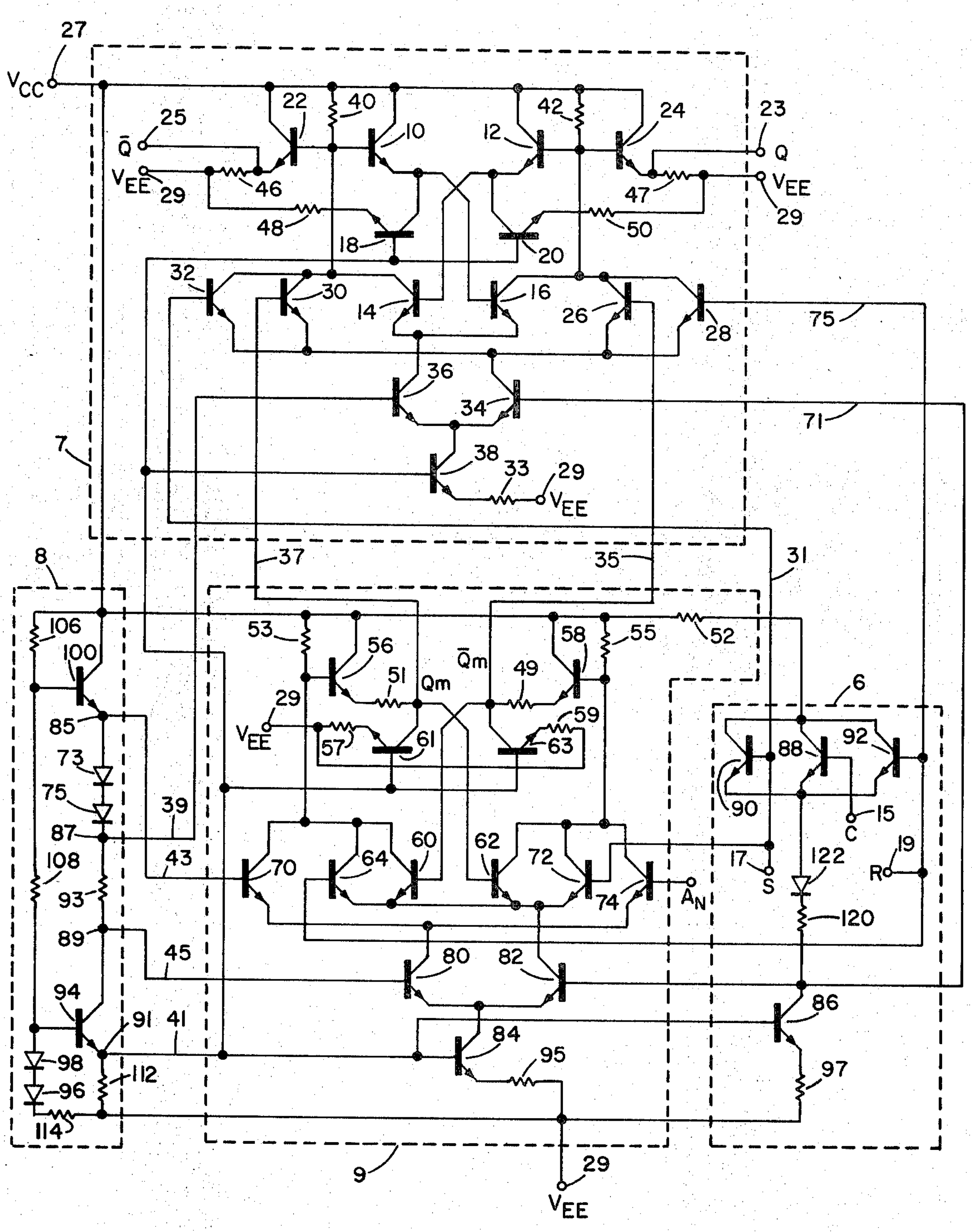
FIG. 3 is a schematic diagram of the master-slave flip-flop of FIG. 2 which has been constructed in a monolithic integrated circuit.

The exact nature of the functional relationship between major sections of the block diagram of FIG. 2 will be explained in more detail with reference to the schematic diagram of FIG. 3. The basic bistable switching elements in both the master and slave portions of the flip-flop will be identified initially. Thereafter, and without further specific identification of the remaining transistors in the flip-flop, the flip-flop operation will be described. In this description of operation each of the transistors in the monolithic integrated flip-flop circuit will be identified with regard to its specific function in the circuit.

The slave flip-flop portion 7 includes a basic internal bistable switching element including first and second emitter-followers 10 and 12 cross-connected to first and second holding transistors 16 and 14 in a bistable circuit configuration wherein only one of the holding transistors 16 and 14 is conducting in each of the two stable states of the flip-flop. A pair of output emitter-follower buffer transistors 22 and 24 are connected as shown to bases of emitter-followers 10 and 12 to provide the desired emitter-follower current drive outputs, and a pair of current source transistors 18 and 20 are connected to emitter-followers 10 and 12. These current source transistors 18 and 20 establish a constant current from the emitter-followers 10 and 12 in each stable state of the flip-flop and provdie a stable DC level at the emitters of the emitter-followers 10 and 12 under static conditions. The operation of the master-slave flip-flop can also be accomplished by replacing transistors 18, 20 and resistors 48, 50 by a pair of resistors between the emitters of transistors 10 and 12 and the power supply $V_{EE}$.

The master portion 9 of the flip flop also includes a basic internal switching element comprising emitter-followers 56 and 58 resistively cross-connected via resistors 51 and 49 to first and second holding transistors 62 and 60. Only one or the other of the holding transistors 62 and 60 conducts in each stable state of the master flip flop portion, and the resistors 51 and 49 provide a desired DC level shift between the emitters of transistors 56 and 58 and the bases of transistors 62 and 60 in order that transistors 62 and 60 may be overridden by set and reset signals applied to transistors 72 and 64. A pair of current sink transistors 61 and 63 are resistively connected through resistors 57 and 59 to a source of emitter potential $V_{EE}$, and these current sink transistors provide a constant current through the level shifting resistors 51 and 49 under static conditions in the flip flop.

The clock, set-reset control network 6 which includes parallel connected clock, set and reset transistors 88, 90 and 92 respectively is connected to a source of collector potential $V_{CC}$ and to master and slave flip flop portions to provide positive control for the master-slave delay flip flop.

OPERATION

Assume for initial conditions that the slave reference transistor 36 is conducting and holding the slave portion 7 of the flip flop in a fixed conductive state. Assume also that the master reference transistor 80 is also conducting and the master control transistor 74 is enabled to receive binary signals for controlling the master portion 9 of the flip flop. However, in the absence of binary signals at a predetermined level applied to the master control transistor 74, the master reference transistor 70 will override the master control transistor 74, pulling current through logic resistor 53 and thus establishing a low base potential at emitter-follower 56 and a high base potential at emitter-follower 58. Assume now that, using positive logic and for purposes of illustration, the clock signal C goes high to a first predetermined logical level. When the base of transistor 88 is at a high level, this level is translated to the base of the master clocking transistor 82 through diode 122, and resistor 120. This same positive going clock transition is also coupled to the base of slave clocking transistor 34, and since the reference potential at the base of the reference transistor 80 is slightly lower than the reference potential at the base of the slave reference transistor 36, the clocking transistor 82 will conduct at a finite time prior to conduction of the slave clocking transistor 34. This feature ensures that the master portion 9 of the flip flop is locked out prior to the time at which the slave portion 7 of the flip flop is enabled.

When the slave clocking transistor 34 is biased into conduction, the slave flip flop portion 7 will be enabled and the conductive state thereof may be changed by binary variations on lines 37 and 35 which connect the level shifting resistors 51 and 49 to the bases of slave control transistors 30 and 26 respectively. Under the conditions which were initially assumed, line 35 is at a high logical level and line 37 is at a low logical level; therefore, transistor 26 is biased into conduction during a high clock condition, pulling down the potential at the base of emitter-follower 12 and at the Q output at the emitter of the output buffer transistor 24. This switching action causes a corresponding rise in potential at the base of the first emitter-follower transistor 10, and this rise in potential will be reflected at the $\overline{Q}$ output terminal of the output buffer transistor 22.

If now the clock signal C at the base of the master-slave clocking transistor 88 goes low again, the slave flip flop portion will again become locked out a finite time prior to the instance at which the master reference transistor 80 overrides the master clocking transistor 82. This switching action enables the master portion 9 of the flip flop to again be conductively controlled, either by control signals applied to the master control transistor 74 or by set and reset signals coupled to the set and reset transistors 72 and 64. If a "high" binary signal is applied to the base of master control transistor 74, this transistor will conduct and override the master reference transistor 70, causing current to flow through logic resistor 55 and into the collector of the lower level master reference transistor 80 which directly feeds the master current sink transistor 84. The conduction of transistor 74 will initiate bistable switching action in the internal bistable switching element of the master portion 9 of the flip flop, and the potential at the emitter of the second emitter-follower transistor 58 will be pulled low and reflected at the base of the slave control transistor 26. Therefore, when the clock signal C shifts high again and the slave flip flop portion 7 is enabled, the conductive state of the slave flip flop portion 7 will be changed by the high potential at the base of slave control transistor 30.

An important and novel feature of this invention which has not been previously described in detail is the particular circuit connection of the set and reset transistors 90 and 92 in the master-slave control network 6 and the connection of the set and reset transistors 28, 32 and 64, 72 in the slave and master portions of the flip flop respectively. If at any time during the clocked operation of the delay flip flop according to this invention, set or reset binary signals are applied to the bases of the master-slave set or reset transistors 90 and 92, the master and slave clocking transistors 82 and 34 will be biased into conduction by a positive going transition at the collector of current sink transistor 86.

For example, if a positive going reset signal R is applied to the base of the master-slave reset transistor 92, then the respective bases of reset transistors 28 and 64 in the slave and master portions of the flip flop will swing to a high logical level at a finite time before the collector of the current sink transistor 86 swings high and biases the slave and master clocking transistors 34 and 82 for conduction. Thus, when the slave clocking transistor 34 is biased for conduction, with the base of reset transistor 28 high, then the slave portion of the flip flop is immediately reset substantially simultaneously with the resetting of the master portion of the flip flop. The slave flip flop portion 7 does not rely upon a change of state in the master portion 9 for its conductive state to be reset upon the application of reset signals R to the master-slave control section 6 of the circuit. The resetting of the master portion of the flip flop as described pulls the $Q_m$ output of the master portion low and the $\overline{Q}m$ output of the master portion high and sets the state of the master flip flop portion consistent with that of the slave portion. Note that the chosen definitions for $Q_m$ and $\overline{Q}_m$ in FIG. 3 necessitates that $Q_m$ be low for Q to be high when the clock rises to its high state.

Another important and novel feature which has not been described in detail is that the master portion of the flip flop is locked out on the leading edge of the positive going clock pulse C and remains locked out during the time that the clock pulse C is high. Therefore, any change of state in the slave portion of the flip flop during this time will not be "seen" by the master portion of the flip flop. It is only at a point on the negative going trailing edge of the clock pulse C that the master portion of the flip flop is enabled as the master clocking transistor 82 is biased non-conductive. This point occurs a finite time after the slave clocking transistor 34 is biased non-conductive to fix the slave portion of the flip flop before the master portion of the flip flop may be conductively controlled by binary signals applied thereto.

The bias driver network 8 which is connected between the collector supply $V_{CC}$ and the emitter supply $V_{EE}$ includes four points 85, 87, 89 and 91 of reference potential which are intermediate the collector potential $V_{CC}$ and the emitter potential $V_{EE}$. The bias driver network 8 includes a current drive transistor 100 which is connected to a current sink transistor 94, the latter transistor being resistively coupled to emitter potential $V_{EE}$ through a current sink resistor 112. A pair of temperature stabilizing diodes 96 and 98 is connected as shown in the base-emitter circuit of current sink transistor 94, and a resistor 114 connects diode 96 to the emitter potential $V_{EE}$. The bases of transistor 94 and 100 are resistively interconnected by a DC level shifting resistor 108, and a bias resistor 106 is connected as shown to the current drive transistor 100.

The first point 85 of intermediate (reference) potential at the emitter of transistor 100 is connected to the base of the master reference transistor 70, which transistor is differentially emitter-coupled to the master control transistor 74. It is this reference potential that the control signals applied to transistor 74 must override in order that the master control transistor 74 is biased into conduction and control the conductive state of the master portion of the flip flop. Point 87 which is two diode drops ($2V_{BE}$) below point 85 is connected to the base of the slave reference transistor 36, and point 89 which is slightly lower in potential than point 87 is connected to the base of the master reference transistor 80. Therefore, since the reference potential which is applied to the master reference transistor 80 is slightly lower than the reference potential applied to the slave reference transistor 36, clock signals C which are applied simultaneously to the slave and master clocking transistors 34 and 82 will bias the clocking transistor 82 into conduction and override the master reference transistor 80 prior to biasing the slave clocking transistor 34 into conduction and overriding the slave transistor 36. This biasing arrangement ensures that the conductive state of the master portion 9 of the flip flop will be fixed prior to the time that the master flip flop information is shifted into the slave portion 7 of the flip flop.

The point 91 at the emitter of the current sink transistor 94 is connected to current sink transistors 84 and 38 in the master and slave portions of the flip flop respectively. These latter current sink transistors which are at the base of a tree-like transistor arrangement in the master and slave flip flop portions sink all of the current flowing through the master and slave flip flop portions respectively.

The bias driver network 8 provides the master and slave portions of the flip flop with fixed bias potentials which are required for proper and stable circuit operation, and network 8 eliminates the need for additional voltage supplies at levels between the $V_{CC}$ and $V_{EE}$ voltage levels. The bias driver network 8 additionally provides good tracking of the reference voltages with varying midswing logic potentials, and improves the noise immunity properties of the flip flop under variations of ambient temperature and voltage supply levels.

The following table of resistor values and voltage levels illustrates those used in one RS flip flop actually built and successfully tested in accordance with the teachings of this invention. However, these values should in no way be construed as limiting the scope of this invention.

TABLE OF VALUES

| Resistor No. | Ohms |
|---|---|
| 33 | 50 |
| 40 | 100 |
| 42 | 100 |
| 46 | 600 |
| 47 | 600 |
| 48 | 244 |
| 49 | 176 |
| 50 | 244 |
| 51 | 176 |
| 52 | 20 |
| 53 | 100 |
| 55 | 100 |
| 57 | 244 |
| 59 | 244 |
| 93 | 95 |
| 95 | 100 |
| 97 | 244 |
| 106 | 263 |
| 108 | 1340 |
| 112 | 805 |
| 114 | 253 |
| 120 | 42 |

| Voltage | Volts |
|---|---|
| $V_{EE}$ | −5.2 |
| $V_{CC}$ | 0 |

We claim:

1. A single phase master-slave delay type current mode flip flop including in combination:

(a) a slave flip flop portion having first and second input terminals for receiving binary logic signals and first and second output terminals for driving digital logic elements which may be connected therto, said slave flip flop portion having an internal bistable flip flop element which may be alternately switched between its two conductive states.

(b) a master flip flop portion including an internal bistable flip flop element which may be alternately switched between its two conductive states, said master flip flop portion having first and second output terminals thereof connected respectively to said first and second input terminals of the slave flip flop portion for conductively controlling the slave flip flop portion when the slave flip flop portion is enabled, (c) clocking means coupled to the internal bistable elements of the master and slave flip flop portions and connectable to a source of clock signals, said (clocking means holding the master portion of the flip flop in a fixed conductive state and enabling the conductive state of the slave portion of the flip flop to be changed when binary clock signals applied thereto are at a first predetermined logical level, said clocking means holding said slave portion of said flip flop in a fixed conductive state and simultaneously enabling binary information to be shifted into the master portion of the flip flop and change the conductive state thereof when said clock signals shift from said first predetermined logical level to a second predetermined logical level, clock signals having first and second levels, said clocking means including:

(1) a slave reference transitor differentially connected to a slave clocking transistor between a current sink and the bistable element of the slave flip flop portion, said slave reference transistor holding the slave portion in a fixed conductive state when said clock signals are at said second level, said slave clocking transistor coupled to the source of clock signals for overriding said slave reference transistor and enabling the conductive state of the bistable element of the slave portion to be changed when said clock signals are at said first level, said clocking means further including (2) a first master reference transitor differentially connected to a master clocking transistor between a current sink and the bistable element of the master flip flop portion, said first master reference transistor being biased into conduction by said clock signals at said second level, said master clocking transistor being biased into conduction by said clock signals at said first level and holding the master portion in a fixed conductive state while the slave clocking transistor is conducting and enabling the slave portion to be switched from one to the other of its two stable states by binary input signals applied thereto, and (d) master control means including a master control transistor differentially conected to a second master reference transistor and connected between the bistable element of the master portion and said first master reference transistor for conductively controlling the master portion when said first master reference transistor is conducting and thereby providing a current path from said master control transistor to said current sink in the master portion, said master control means being enabled by said clocking means when said binary clock signals are shifted to said second level for changing the conductive state of the master portion in response to binary information signals applied to said master control means, the information represented by this change of state of the master portion being shifted into the first and second input terminals in the slave portion when the clock signals are returned to said first level.

2. The flip flop according to claim 1 which further includes set and reset control means connectable to a source of set and reset binary signals and connected to the master and slave portions of the delay flip flop for asychronously controlling the master and slave portions of the flip flop independentdly of the binary clock signals applied thereto.

3. The flip flop according to claim 1 wherein said clocking means includes a master-slave clocking transistor connected in parallel with a master-slave set transistor and a master-slave reset transistor, each of said master-slave clocking, set and reset transistors connected to said clocking transistors in the master slave flip flop portions whereby the application of clock signals, set signals, and reset signals to said master-slave clocking transistor, said master-slave set transistor and said master-slave reset transistor respectively will turn on said master clocking transistor and said slave clocking transistor.

4. A master-slave delay type current mode flip flop including in combination::

(a) a slave flip flop portion having an internal bistable element comprising first and second emitter-follower transistors cross-connected respectively to first and second holding transistors in a bistable circuit configuration wherein said first and second holding transistors are alternately conducting as the slave flip flop portion is switched between its two stable states, first and second slave control transistors connected respectively in parallel with said first and second holding transistors and further connected to receive binary signals for changing the conductive state of the slave portion of the flip flop, (b) a master flip flop portion having an internal bistable element comprising first and second emitter-follower transistors cross-connected respectively to first and second holding transistors in a bistable circuit configuration wherein the first and second holding transistors are alternately conducting as the master flip flop portion is switched back and forth between its two stable states, said master flip flop portion having first and second output terminals connected respectively to said first and second slave control transistors of the slave flip flop portion, the slave flip flop portion being conductively controlled by the master flip flop when said slave flip flop portion is enabled by a clocking transistor means;

(c) a master reference transistor and a master control transistor differentially connected to each other and connected respectively to said second and first holding transistors in the master flip flop portion for controlling the conductive state of the master portion of the flip flop; and (d) clocking transistor means connectable to a source of clock signals and differentially connected to said master and slave portions of the flip flop for enabling the slave portions of the flip flop to be switched from one to the other of its two conductive states and for locking the master portion of the flip flop in its previous conductive state when said clock signals are at a first predetermined logical level, said clocking means locking said slave portion of the flip flop in its previous conductive state and enabling the master portion of the said flip flop to be switched from one to the other of its two conductive states when said clock signals are shifted to a second predetermined logical level and thereby enabling conduction in said master control transistor when binary logic signals are applied thereto from a single ended driving source.

5. The flip flop according to claim 4 wherein:

(a) said first and second emitter-follower transistors in the master portion of the flip flop resistively connected to said first and second holding transistors in said master portion for shifting the DC levels at said first and second holding transistors to a value which will enable said first and second holding transistors to be overridden by set and reset signals applied to transistors which may be connected in parallel with said first and second holding transistors; said first and second emitter-follower transistors in said master portion also connected to said first and second slave control transistors in the slave portion of the flip flop for applying binary signals to said first and second slave control transistors, which will change the conductive state of said slave portion when it is enabled by clock signals at said predetermined logical level;

(b) said clocking means includes a slave reference differentially connected to a slave clocking transistor between said bistable element of the slave portion of the flip flop and a current sink, said slave reference transistor connected to a common junction of said first and second holding transistors for holding the slave portion of the flip flop in a fixed conductive state when a reference voltage applied to said slave reference transistor overrides a clock signal applied to said slave clocking transistor, said slave clocking transistor connected to a common output point of said first and second slave control transistors for enabling current to flow therethrough when said clock signals are at said first predetermined logical level and thereby enable the stage of the slave portion of the flip flop to be changed, and (c) said clocking means further including a second master reference transistor differentially connected to a master clocking transistor between the bistable element of the master portion of the flip flop and a curernt sink, said master clocking transistor connected to said first and second holding transistors in the bistable element of the master portion of the flip flop for providing a current path therefor and holding the master portion of the flip flop in a fixed conductive state when clock signals applied to said master clocking transistor override a reference potential applied to said second master reference transistor, said second master reference transistor connected to a common output point of said first named master reference transistor and said master control transistor for providing a current path therethrough and permiting the master portion of the flip flop to be conductively controlled by binary signals applied to said master control transistor.

6. The flip flop according to claim 5 which further includes:

(a) set and reset transistors connected in parallel with said first and second slave control transistors in the slave portion of the flip flop and connectable to a sourec of set and reset binary input signals, (b) set and reset input transistors connected in parallel with said first and second holding transistors in the master portion of the flip flop and connectable to said sources of set and reset binary input signals respectively, and (c) said clocking means further including a master-slave clocking transistor, a master-slave set transistor, and a master-slave reset transistor, all connected in parallel with each other and connected to receive binary clocking, set and reset input signals respectively; said master-slave clocking, set and reset transistors connected to a common point to which said master clocking transistor and said slave clocking transistor are connected, any one of said master-slave clocking, master-slave set or master-slave reset transistors operative to be biased into conduction by the application of clocking, set and reset signals applied thereto and thereby biasing said master and slave clocking transistors into conduction.

7. The flip flop according to claim 6 which further includes a bias driver means connected across a power supply and having first, second, third and fourth intermediate points of reference potential, diminishing in level from said first point to said fourth point, said first point of reference potential connected to said first-named master reference transistor for biasing said first-named master reference transistor into conduction when the reference potential at said first point overrides a binary signal applied to said master control transistor, said second point of reference potential connected to said slave reference transistor and said third point of reference potential connected to said second master reference transistor whereby clock signals which are simultaneously applied to said slave and master clocking transistors and will cause said second master reference transistor to be overridden by said master clocking transistor a finite period of time before said slave reference transistor is overridden by clock signals applied to said slave clocking transistor and thereby ensuring that the master portion of the flip flop is locked in a fixed conductive state prior to the time that said slave portion of the flip flop is enabled, and said fourth point of reference potential connected to the current sink in each of said master and slave portions of the flip flop to bias said current sinks conducting and provide a substantially constant current path in each portion of the flip flop.

References Cited

UNITED STATES PATENTS

| | | | |
|---|---|---|---|
| 2,985,771 | 5/1961 | Halpern | 307—269 |
| 3,225,301 | 12/1965 | McCann | 307—269 |
| 3,307,047 | 2/1967 | Narud et al. | 307—208 |
| 3,351,778 | 11/1967 | Seelbach et al. | 307—247 |

JOHN S. HEYMAN, Primary Examiner

H. A. DIXON, Assistant Examiner

U.S. Cl. X.R.

307—247